(12) United States Patent
Martin

(10) Patent No.: US 6,673,156 B2
(45) Date of Patent: *Jan. 6, 2004

(54) SEMICONDUCTOR PROCESSING DEVICE

(75) Inventor: Maynard Martin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/264,232

(22) Filed: Oct. 1, 2002

(65) Prior Publication Data

US 2003/0032289 A1 Feb. 13, 2003

Related U.S. Application Data

(62) Division of application No. 09/535,667, filed on Mar. 13, 2000, which is a continuation of application No. 08/906,572, filed on Aug. 4, 1997, now Pat. No. 6,086,778, which is a continuation of application No. 08/504,839, filed on Jul. 20, 1995, now Pat. No. 5,688,359.

(51) Int. Cl.⁷ .......................... B05D 1/00; B05D 13/00
(52) U.S. Cl. .................. 118/718; 118/715; 156/345.2
(58) Field of Search ....................... 118/718, 715; 156/345.2

(56) References Cited

U.S. PATENT DOCUMENTS

| | | | |
|---|---|---|---|
| 4,037,945 A | | 7/1977 | Wollam |
| 4,124,437 A | * | 11/1978 | Bond et al. ................. 216/92 |
| 4,126,510 A | * | 11/1978 | Moscony et al. ............ 216/54 |
| 4,233,108 A | * | 11/1980 | Tamura et al. ............... 216/91 |
| 4,557,785 A | * | 12/1985 | Ohkuma ..................... 156/345 |
| 4,834,020 A | | 5/1989 | Bartholomew et al. |
| 5,002,627 A | | 3/1991 | Scheithauer et al. |
| 5,136,975 A | * | 8/1992 | Bartholomew et al. ..... 118/715 |
| 5,362,328 A | | 11/1994 | Gardiner et al. |
| 5,413,671 A | * | 5/1995 | Ketchum ..................... 216/37 |
| 5,522,412 A | | 6/1996 | Ohba et al. |
| 5,523,261 A | | 6/1996 | Sandhu |
| 5,688,359 A | * | 11/1997 | Martin .................. 156/345.19 |
| 5,797,195 A | * | 8/1998 | Huling et al. ................. 34/404 |
| 5,830,805 A | | 11/1998 | Shacham-Diamand et al. |
| 6,086,778 A | * | 7/2000 | Martin ........................ 216/83 |

\* cited by examiner

*Primary Examiner*—Parviz Hassanzodel
*Assistant Examiner*—Sylvia MacArthur
(74) *Attorney, Agent, or Firm*—Ormiston & McKinney, PLLC

(57) ABSTRACT

A novel modular muffle etch injector assembly for use in a gas blanketed down-flow chemical vapor deposition apparatus of the type having a muffle and a modular gas injector assembly for introducing chemical vapors into a deposition chamber, the muffle being adapted for receiving and supporting the gas injector assembly, wherein deposition material residue collects on a lower surface of the muffle. The etch injector assembly of the present invention comprises an etch chamber having vertical sidewalls, a closed top end and an open bottom end, a supply mechanism for introducing a liquid etchant into the etch chamber, and a sealing device disposed along the open end of the etch chamber for providing a seal between the etch chamber and the lower surface of the muffle to confine the etchant to the etch chamber. The etch injector assembly preferably also includes an exhaust means for removing chemical vapors from the etch chamber. The etch injector assembly is adapted to replace the gas injector assembly within the deposition chamber during maintenance operations for removing the residue from the lower surface of the muffle by introducing the liquid etchant into the etch chamber and on to the lower surface of the muffle.

9 Claims, 5 Drawing Sheets

SEMICONDUCTOR PROCESSING DEVICE

CROSS REFERENCE TO RELATED APPLICATIONS

This is a division of application Ser. No. 09/535,667, filed Mar. 13, 2000, which is a continuation of application Ser. No. 08/906,572, filed Aug. 4, 1997, now U.S. Pat. No. 6,086,778 which is a continuation of application Ser. No. 08/504,839, filed Jul. 20, 1995, now U.S. Pat. No. 5,688,359.

FIELD OF THE INVENTION

The invention relates to an apparatus for removing deposition material residue that collects on the lower surface of the muffle in a gas blanketed down-flow type chemical vapor deposition reactor used in the fabrication of semiconductor devices.

BACKGROUND OF THE INVENTION

Semiconductor devices typically include patterned layers of electrically conductive, non-conductive and semi-conductive materials stacked over a silicon wafer. The various layers of material are successively deposited on the wafer and etched into predefined patterns to form individual component structures within the particular device being fabricated. Chemical vapor deposition ("CVD") reactors are commonly used for depositing layers of material by introducing select reactant gases into a controlled environment surrounding the wafer. One type of CVD reactor, referred to herein as a gas blanketed down-flow reactor, introduces the reactant gases downward through vertical channels over a wafer positioned horizontally beneath the channels. One such CVD reactor are the Watkins Johnson Company Models WJ-996, WJ 999R 3.3 and WJ 999R 3.5. In this type of CVD reactor, a conveyor belt moves the wafers through an elongated box like chamber called a "muffle." The conveyor belt travels along and is supported by the lower surface of the muffle. Multiple chemical vapor deposition chambers are located within the muffle. A modular gas injector assembly is positioned at each deposition chamber. The gas injector assembly introduces reactant gases into the deposition chamber. The wafers on the conveyor belt travel through each deposition chamber wherein the surface of the wafer is exposed to the gases and coated with the desired materials. Each gas injector assembly includes an array of plenums and passageways for properly mixing and directing the gases to the surface of the wafers. The injector assemblies also include exhaust ports for removing chemical vapors from the deposition chamber.

During the deposition process, deposition material residue collects on the conveyor belt and on the lower surface of the muffle within the deposition chambers. The residue is continuously removed from the conveyor belt by passing the belt through an etching station outside the muffle. Excessive residue build-up on the lower surface of the muffle can cause the conveyor belt to move unevenly through the deposition chambers, thereby adversely affecting the uniformity of the materials deposited on the surface of the wafers. Consequently, the reactor is periodically shut down to remove the residue that has collected on the lower surface of the muffle. During this shutdown, the conveyor belt is removed from the muffle and the gas injector assemblies are replaced with etch injector assemblies. Presently, so far as applicant is aware, etch injector assemblies for gas blanketed down-flow type reactors such as the Watkins Johnson models noted above are constructed to introduce a vaporized etchant into the deposition chamber and on to the exposed lower surface of the muffle to etch away the deposition material residue. In order to reduce the time necessary to clean the muffle and thereby minimize the time the reactor is out of production, it is desirable to use a liquid etchant to remove the residue from the muffle. The present invention is directed to the etch injector assembly that allows for the introduction of a liquid etchant into an etch chamber and on to the lower surface of the muffle to more rapidly remove deposition material residue from the muffle.

SUMMARY OF THE INVENTION

Accordingly, it is one object of the invention to introduce a liquid etchant directly on to the lower surface of the muffle of a gas blanketed down-flow CVD reactor during maintenance operations to remove deposition material residue that has collected on the lower surface of the muffle.

It is another object to provide a sealed and self-contained etch chamber for use with a liquid etchant.

It is a further object to provide a modular etch injector assembly adapted to replace modular gas etch injector assemblies used in gas blanketed down-flow CVD reactors during such maintenance operations.

These and other objects are achieved by a novel modular muffle etch injector assembly for use in a gas blanketed down-flow chemical vapor deposition apparatus of the type having a muffle and a modular gas injector assembly for introducing chemical vapors into a deposition chamber, the muffle being adapted for receiving and supporting the gas injector assembly, wherein deposition material residue collects on a lower surface of the muffle. The etch injector assembly of the present invention comprises an etch chamber having vertical sidewalls, a closed top end and an open bottom end, a supply mechanism for introducing a liquid etchant into the etch chamber, and a sealing device disposed along the open end of the etch chamber for providing a seal between the etch chamber and the lower surface of the muffle to confine the etchant to the etch chamber. The etch injector assembly preferably also includes an exhaust means for removing chemical vapors from the etch chamber. The etch injector assembly is adapted to replace the gas injector assembly within the deposition chamber during maintenance operations for removing the residue from the lower surface of the muffle by introducing the liquid etchant into the etch chamber and on to the lower surface of the muffle.

In another aspect of the invention, the etch injector assembly comprises a box-shaped etch chamber having a rectangular cross section and being open at its bottom end. The etch chamber is characterized by opposing sidewalls, opposing endwalls extending between the sidewalls, and a top cover plate attached to the sidewalls and endwalls. Inlet and exhaust ports are formed in the cover plate. The liquid etchant is introduced into the etch chamber through the inlet port. Chemical vapors are removed from the etch chamber through the exhaust port. A sealing device such as an "O" ring is positioned along the bottom surfaces of the sidewalls and endwalls for providing a seal between the open end of the etch chamber and the lower surface of the muffle to confine the etchant to the etch chamber. The etch injector assembly is sized and shaped to replace the gas injector assembly during maintenance operations for removing the residue from the lower surface of the muffle by introducing the liquid etchant into the etch chamber and on to the lower surface of the muffle.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

The figures are not meant to be actual views of the various embodiments, but merely idealized representations used to depict the structure of the invention.

DETAILED DESCRIPTION OF THE INVENTION

Figure 1:
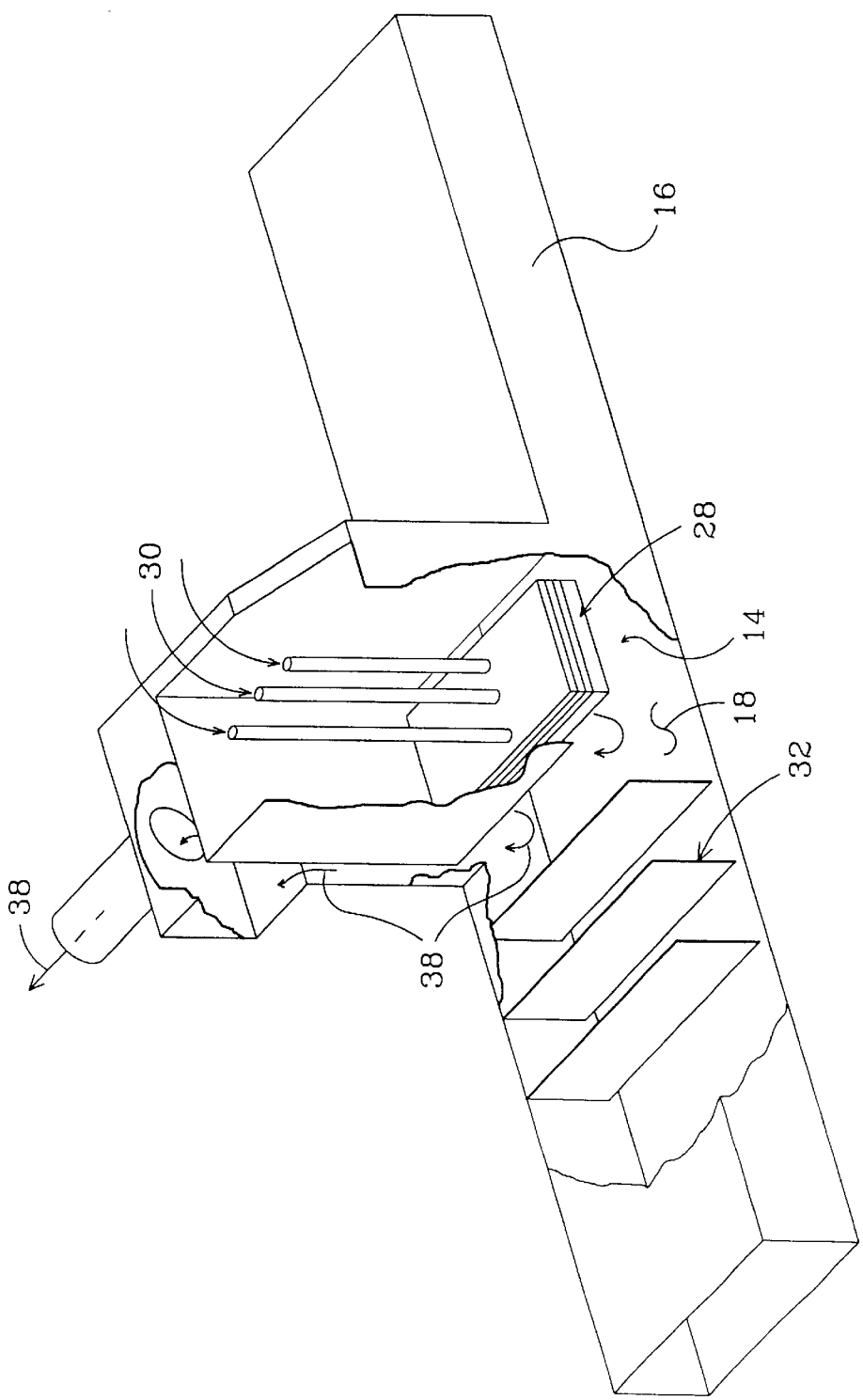
FIG. 1 is a perspective schematic representation of a gas blanketed down-flow chemical vapor deposition reactor.
Figure 2:
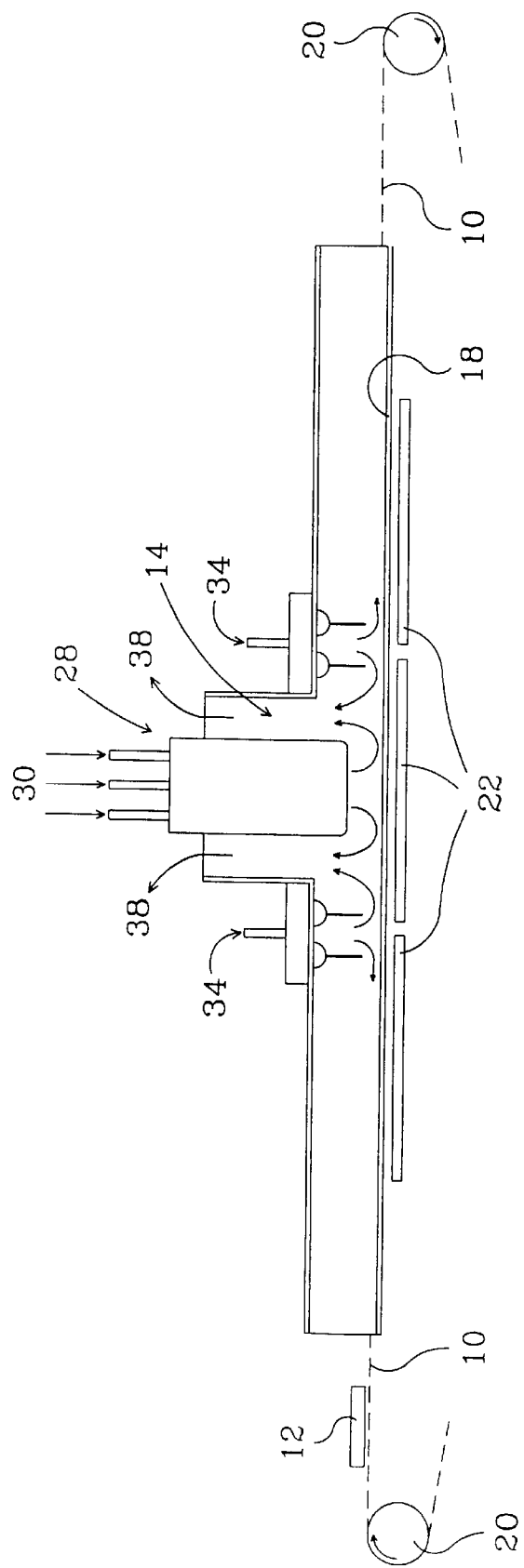
FIG. 2 is a cross-section schematic representation of a gas blanketed down-flow chemical vapor deposition reactor.
Figure 3:
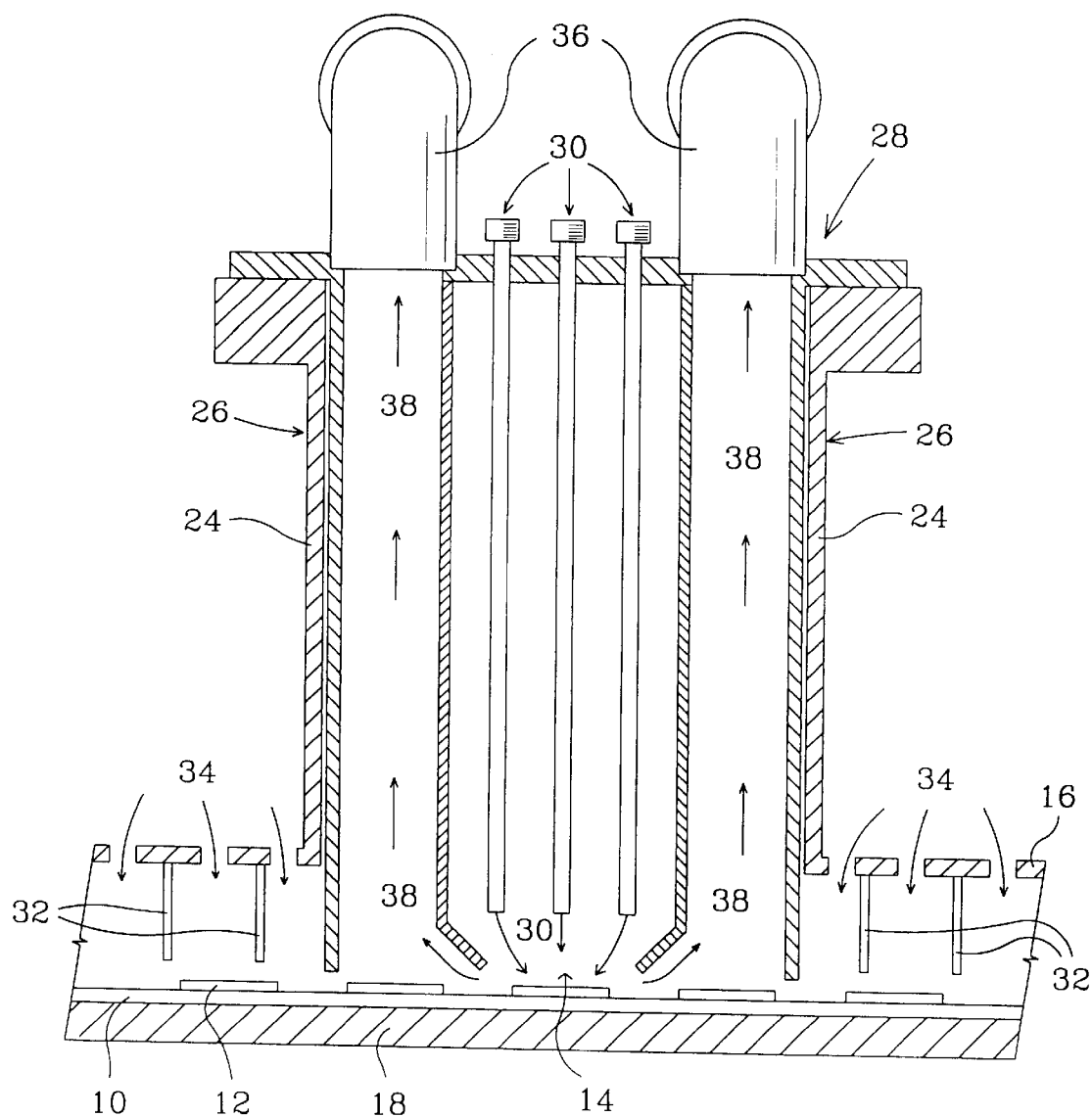
FIG. 3 is a cross-section schematic representation of a gas injector assembly and deposition chamber for a gas blanketed down-flow chemical vapor deposition reactor.

FIGS. 1–3 illustrate the pertinent portions of a typical gas blanketed down flow CVD reactor into which the muffle etch injector assembly of the present invention may be incorporated. Referring first to FIGS. 1 and 2, a conveyor belt 10 carries semiconductor wafers 12 through a deposition chamber 14 in muffle 16. The CVD reactor will typically include several similarly constructed deposition chambers spaced sequentially along the muffle. Belt 10 is supported by the lower surface 18 of muffle 16 and conveyed by rollers 20. Heating elements 22 are positioned under the lower surface 18 of muffle 16 to heat the interior of muffle 16.

Referring to FIG. 3, the upright walls 24 of the muffle 16 form a rectangular box-like sleeve 26 to receive and support a modular gas injector assembly 28. The gas injector assembly 28 introduces reactant gases into deposition chamber 14 through a series of plenums and passageways as indicated by gas arrows 30 in FIGS. 1–3. An inert purge gas, typically nitrogen, is introduced into the deposition chamber 14 along curtains 32 immediately before and after the gas injector assembly 28, as indicated by purge arrows 34. Chemical vapors are removed from the deposition chamber 14 through exhaust tube 36 as indicated by exhaust arrows 38.

During operation, deposition materials collect on the conveyor belt 10 carrying the wafers 12 and on the supporting lower surface 18 of the muffle 16 that is exposed to the reactant gases within deposition chamber 14. These residual deposition materials are continuously removed from the conveyor belt 10 by passing the belt through an etching station (not shown) outside the reactor. The residue that collects on the lower surface 18 of the muffle 16 is periodically removed by shutting down the reactor, removing the gas injector assembly 28, and replacing it with a muffle etch injector assembly that introduces an etchant into the deposition chamber 14 and on to the lower surface 18 of the muffle 16. So far as applicant is aware, muffle etch injector assemblies have heretofore introduced a vaporized etchant into the deposition chamber in much the same way the deposition gases are used. Although other maintenance operations may be performed on the reactor during the time the reactor is shut down and out of production, the muffle etch is usually the most time consuming maintenance operation.

Figure 4:
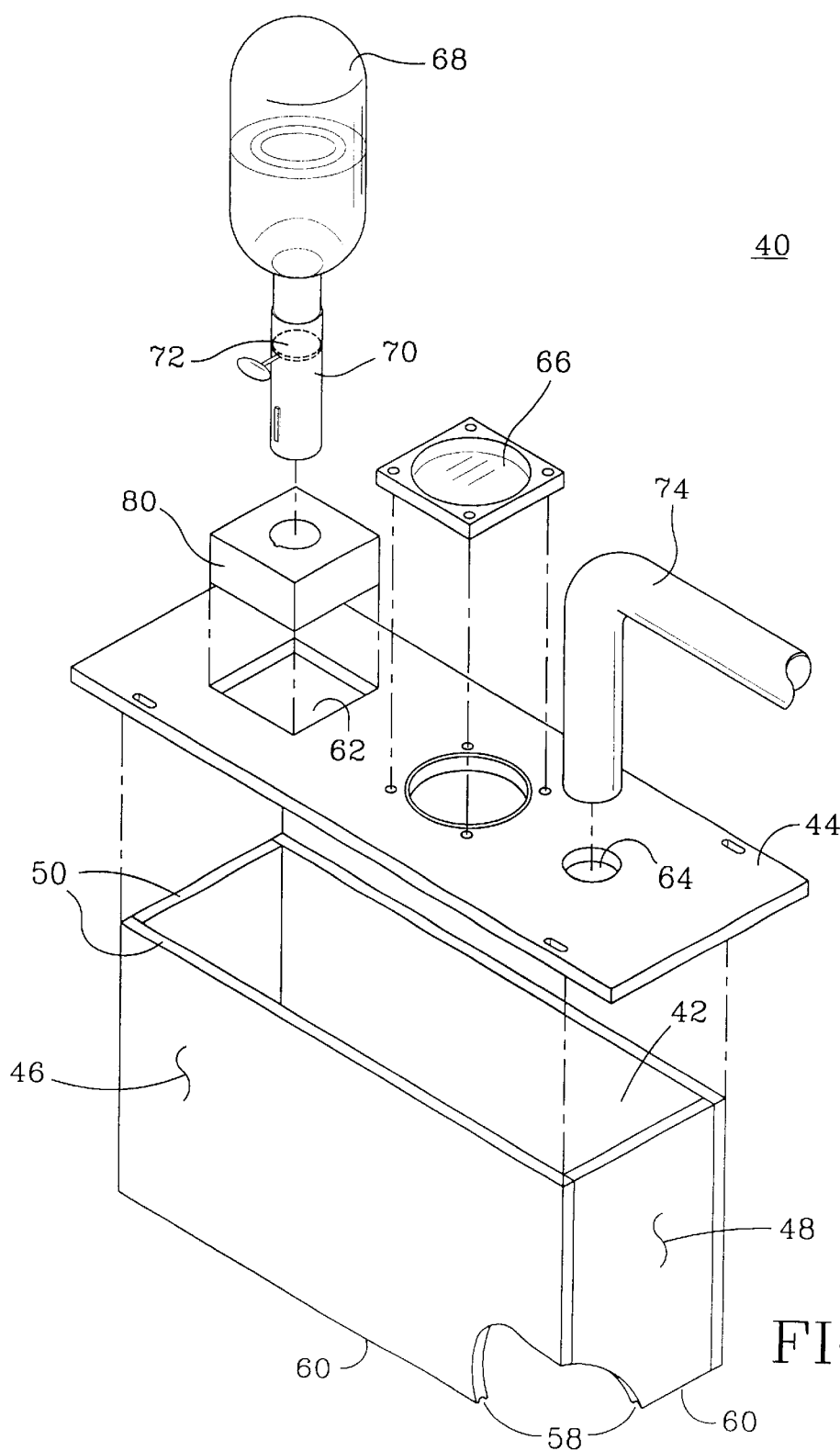
FIG. 4 is a perspective view of a muffle etch injector assembly constructed according to the preferred embodiment of the invention.
Figure 5:
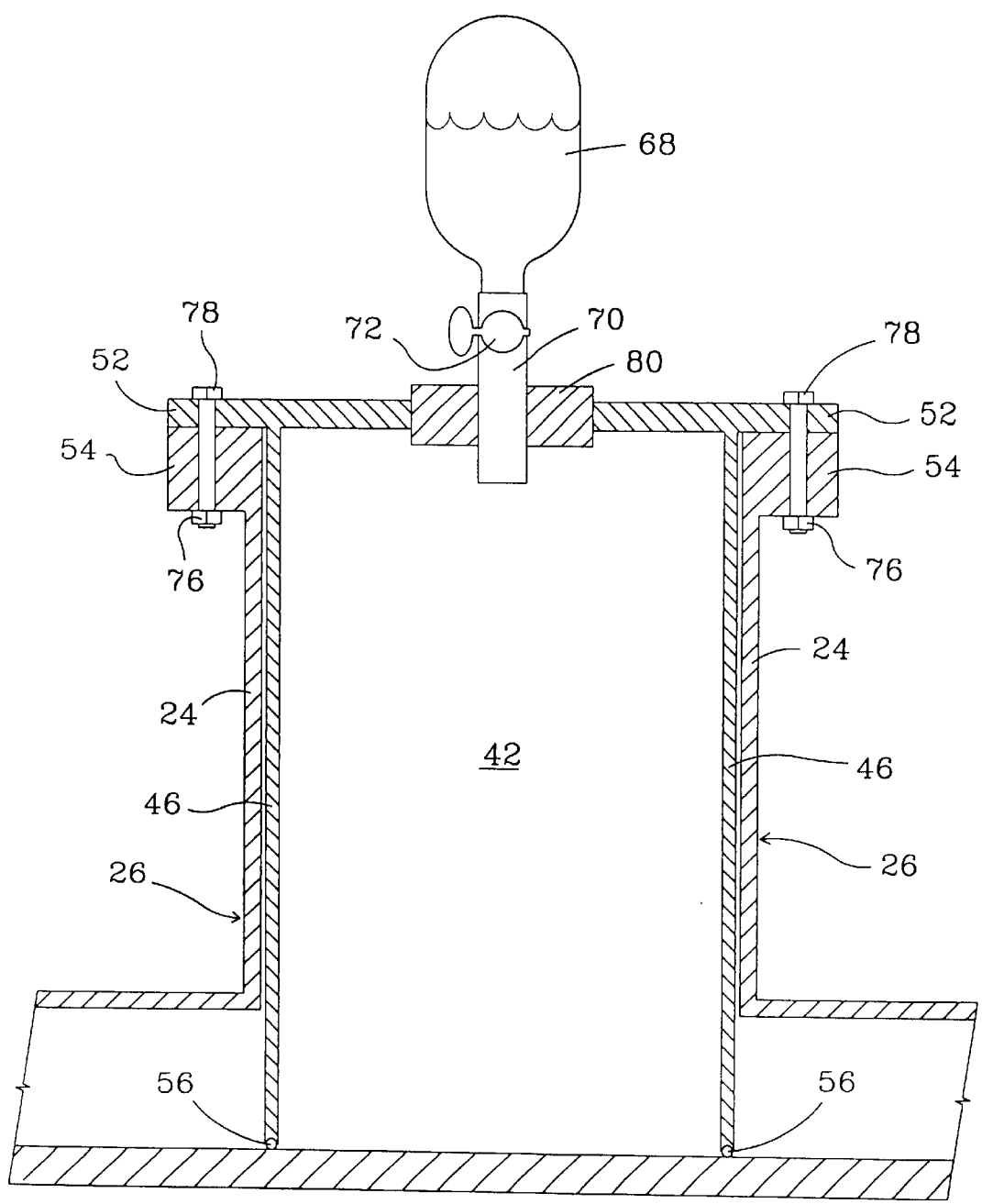
FIG. 5 is a cross-section view of the muffle etch injector assembly installed in the muffle sleeve of a gas blanketed down-flow chemical vapor deposition reactor.

The muffle etch injector assembly of the present invention, illustrated in FIGS. 4 and 5, provides for the introduction of a liquid etchant directly on to the lower surface 18 of the muffle 16 in a self contained and sealed environment, thereby reducing the time required to remove the residue from the muffle and minimizing the time the reactor is out of production. Referring to FIGS. 4 and 5, modular muffle etch injector assembly 40 includes a box shaped etch chamber 42 and a top cover plate 44. Etch chamber 42 is defined by opposing sidewalls 46 and opposing endwalls 48 that extend between sidewalls 46. Cover plate 44 is attached to and extends beyond the top surfaces 50 of sidewalls 46 and endwalls 48. Etch chamber 42 is sized and shaped to fit within sleeve 26 of muffle 16 and to extend down to the lower surface 18 of the muffle 16 when the etch injector assembly 40 is installed in the reactor. That portion of cover plate 44 extending beyond sidewalls 46 and endwalls 48 forms a flange area 52 that rests on flange support 54 of sleeve 26. In this way, muffle etch assembly 40 can be installed in place of the gas injector assembly 28 during maintenance operations on the reactor.

An "O" ring 56 or other suitable sealing device is positioned in recess 58 along the bottom surfaces 60 of sidewalls 46 and endwalls 48 to provide a seal between the open end of the etch chamber 40 and the lower surface 18 of the muffle 16 to confine the etchant to the etch chamber. Cover plate 44 includes an inlet port 62, through which the liquid etchant is introduced into the etch chamber 42, and an exhaust port 64, through which chemical vapors are removed from the etch chamber 42. Preferably, cover plate 44 also includes a sight glass 66 through which the lower surface 18 of the muffle 16 may be observed. One of the disadvantages of the prior art etch injector assemblies is the inability to readily monitor the removal of residue from the muffle. Previously, it was necessary to remove the etch injector assembly to determine whether the removal was complete. Sight glass 66 allows the operator to readily determine the progress of the etch without removing the etch injector assembly.

The liquid etchant is preferably supplied by means of a local reservoir 68, a conduit 70 connected to the reservoir 68 and the inlet port 62, and a valve 72 in conduit 70. Reservoir 68, conduit 70 and valve 72 are referred to herein jointly as the etchant supply assembly. An optional adapter 80 couples the conduit 70 to the inlet port 62. Valve 72 is operative to move from an open position in which the etchant flows from the reservoir 68 through the conduit 70 into the etch chamber 42, to a closed position in which the etchant is prevented from flowing from the reservoir 68. Exhaust tube 74 is attached to exhaust port 64 to facilitate the removal of chemical vapors generated during etching of the muffle 16. Preferably, exhaust tube 74 is sized, shaped and positioned for easy connection to the exhaust system already in place to remove chemical vapors generated during material deposition.

The various components of the muffle etch injector assembly are preferably made of Poly Vinylidene Flouride (PVDF) or any suitable structural material that is resistant to the liquid etchant. In operation, and after the reactor is shutdown, the gas injector assembly is removed from the reactor and replaced with the muffle etch injector assembly. The etch injector assembly 40 is fixed in position by means of nuts 76 and bolts 78 or other suitable fasteners. The exhaust tube 74 is attached to the reactor exhaust system (not shown) and the etchant supply assembly is installed into the inlet port 62. The valve 72 is opened to allow the liquid etchant to flow into the etch chamber 42 and on to the lower surface 18 of the muffle 16. After the deposition material residue has been removed from the muffle, the etch injector assembly is removed from the reactor and the gas injector assembly re-installed.

There has been shown and described a novel muffle etch injector assembly which provides for the introduction of a liquid etchant directly on to the lower surface of the muffle in a self contained and sealed environment, thereby reducing the time required to remove the residue from the muffle. The particular embodiments shown in the drawings and described herein are for purposes of example and should not be construed to limit the invention as set forth in the appended claims.

What is claimed is:

1. An injector assembly for a semiconductor fabrication device, the assembly comprising a housing defining an open end, wherein the housing is configured to contact the semiconductor fabrication device in a flush manner at the open end, and wherein the housing is further configured to contact the semiconductor fabrication device in a region of the device that is generally designated for a deposition process.

2. The assembly in claim 1, further comprising a seal coupled to the housing and located around the open end.

3. The assembly in claim 2, wherein the housing further defines a port that is configured to receive a liquid.

4. The assembly in claim 3, wherein the housing comprises a closed end opposing the open end, and wherein the closed end defines the port.

5. An injector for a muffle, wherein the muffle defines a first open end and comprises a first surface opposing the first open end, the injector comprising a container defining a second open end; wherein the container comprises a second surface opposing the second open end; and wherein the second open end is configured to contact the first surface of the muffle.

6. The injector in claim 5, wherein the second open end is configured to form a liquid-tight seal with the first surface.

7. The injector in claim 6, wherein the container defines an opening configured to receive an etchant.

8. The injector in claim 7, wherein the opening is configured to receive a liquid.

9. The injector in claim 8, wherein the second surface is configured to contact the first open end of the muffle.

* * * * *